(12) United States Patent
Kobayashi

(10) Patent No.: US 7,816,935 B2
(45) Date of Patent: Oct. 19, 2010

(54) TEST APPARATUS

(75) Inventor: Shinichi Kobayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 188 days.

(21) Appl. No.: 12/055,329

(22) Filed: Mar. 26, 2008

(65) Prior Publication Data

US 2009/0295418 A1  Dec. 3, 2009

Related U.S. Application Data

(63) Continuation of application No. PCT/JP2007/056483, filed on Mar. 27, 2007.

(51) Int. Cl.
*G01R 31/26* (2006.01)
*G01R 31/28* (2006.01)

(52) U.S. Cl. .................. 324/763; 324/617; 324/765; 324/158.1; 714/707; 714/715; 714/731

(58) Field of Classification Search ............. 324/158.1, 324/754–765; 714/715–744
See application file for complete search history.

(56) References Cited

U.S. PATENT DOCUMENTS

| | | | | |
|---|---|---|---|---|
| 5,710,744 A | * | 1/1998 | Suda | 368/120 |
| 5,942,911 A | * | 8/1999 | Motika et al. | 324/769 |
| 6,028,439 A | * | 2/2000 | Arkin et al. | 324/765 |
| 6,057,691 A | * | 5/2000 | Kobayashi | 324/617 |
| 6,255,839 B1 | * | 7/2001 | Hashimoto | 324/765 |
| 6,586,924 B1 | * | 7/2003 | Okayasu et al. | 324/158.1 |
| 6,779,140 B2 | * | 8/2004 | Krech et al. | 714/718 |
| 6,956,395 B2 | * | 10/2005 | Oshima et al. | 324/765 |
| 7,359,822 B2 | * | 4/2008 | Fujiwara et al. | 702/120 |
| 7,549,101 B2 | * | 6/2009 | Chiba | 714/744 |
| 2005/0134287 A1 | * | 6/2005 | Satou | 324/537 |
| 2006/0279274 A1 | * | 12/2006 | Yamanaka | 324/158.1 |
| 2008/0258749 A1 | * | 10/2008 | Yamada | 324/763 |

FOREIGN PATENT DOCUMENTS

| | | |
|---|---|---|
| JP | 10227843 | 8/1998 |
| JP | 11014714 | 1/1999 |
| JP | 2001176294 | 6/2001 |
| JP | WO03/062843 | 7/2003 |
| JP | 2004264047 | 9/2004 |
| JP | 2005533253 | 11/2005 |

* cited by examiner

*Primary Examiner*—Ha Tran T Nguyen
*Assistant Examiner*—Emily Y Chan
(74) *Attorney, Agent, or Firm*—Jianq Chyun IP Office

(57) ABSTRACT

Provided is a test apparatus that tests a device under test, including a first pipeline that sequentially propagates pieces of pattern data included in a first test pattern, according to a first test period, and outputs the resulting data to the device under test; a second pipeline that sequentially propagates pieces of pattern data included in a second test pattern, according to a second test period that is different from the first test period, and outputs the resulting data to the device under test; a timing control section that controls at least one of a timing at which the first pipeline begins propagating a predetermined first pattern data and a timing at which the second pipeline begins propagating a predetermined second pattern data, based on the first test period and the second test period; and a judging section that judges pass/fail of the device under test based on a signal output by the device under test.

13 Claims, 4 Drawing Sheets

| FIRST TEST SEQUENCE | SECOND TEST SEQUENCE |
|---|---|
| 1 NOP | 1 NOP |
| 2 NOP | |
| 3 NOP | 2 NOP |
| 4 NOP | |
| 5 NOP | 3 SNDC |
| 6 SNDC | |
| 7 NOP | 4 NOP |
| 8 NOP | |
| 9 NOP | 5 NOP |
| 10 NOP | |
| 11 NOP | 6 NOP |
| 12 NOP | |
| 13 NOP | 7 NOP |
| 14 NOP | |
| 15 NOP | 8 NOP |
| 16 NOP | |
| 17 NOP | 9 JECH |
| 18 JECH | |
| 19 NOP (PD1) | 10 NOP (PD2) |

*FIG. 3*

TEST APPARATUS

CROSS REFERENCE TO RELATED APPLICATION

This is a continuation application of PCT/JP2007/056483 filed on Mar. 27, 2007, the contents of which are incorporated herein by reference.

BACKGROUND

1. Technical Field

The present invention relates to a test apparatus. More particularly, the present invention relates to a test apparatus that tests a device under test, such as a semiconductor circuit, with different test periods.

2. Related Art

Testing a device under test, such as a semiconductor circuit, with different test periods involves inputting a prescribed test pattern to each pin of the device under test and judging whether the device under test is operating correctly. The test pattern may be a pattern signal that includes a prescribed data pattern, a clock signal having a prescribed period, or a control signal that operates the device under test.

Each test pattern is generated by a corresponding test module of the test apparatus. For example, each test module may generate a test pattern having a prescribed pattern by performing a preset test sequence with a test period corresponding to the test pattern to be generated. More specifically, each test module may generate a test pattern having a prescribed logic pattern by outputting a plurality of supplied logic patterns in an order designated by the test sequence. When each test pattern has a different period, the test period at which each test module operates may be different as well (e.g. International Publication Pamphlet No. 2003/062843 and Japanese Patent Application Publication No. 11-14714).

It is desirable that the test patterns be input in synchronization to the pins of the device under test. One way of achieving this is by synchronizing the timings at which each test module begins to supply the test pattern to the device under test (e.g. International Publication Pamphlet No. 2003/062843).

The test modules sequentially generate the logic patterns according to the test sequence. The test modules sequentially transmit these logic patterns to the device under test through pipelines operating in accordance with the test period. In other words, by controlling the timing at which the signal begins to be output from the final circuit of each pipeline, the timings at which each test module begins to supply the test pattern to the device under test can be synchronized. More specifically, a logic pattern corresponding to the number of stages of each pipeline is generated and stored in the corresponding pipeline, and a test pattern begins to be output from the last circuit of each pipeline at substantially the same time. By performing such an operation, a plurality of test modules having different test periods can begin to supply each test pattern in synchronization.

The referenced Patent Documents include International Publication Pamphlet No. 2003/062843 and Japanese Patent Application Publication No. 11-14714.

The test sequence performed by each test module may includes a repeat instruction that creates a loop during testing until a prescribed condition is fulfilled. For example, each test module may repeatedly generate a constant logic pattern until the test apparatus, the device under test, and the like fulfills the prescribed condition during testing. When the prescribed condition is fulfilled, each test module may output the logic pattern corresponding to the subsequent test sequence.

In this case as well, it is desirable to synchronize the timings at which each test module supplies the logic pattern corresponding to the subsequent test sequence to the device under test. However, even when the timing at which each test module performs the subsequent test sequence is synchronized, the timing at which the subsequent logic pattern is output from the final stage of each pipeline may be out of synchronization due to a difference in the number of stages in the pipeline and the test period of each test module.

While the repeat instruction is being performed, the logic pattern used to create the loop is stored in the pipeline. Therefore, the logic pattern corresponding to the subsequent test sequence after exiting the loop cannot be stored in the pipeline in advance, so that the logic patterns after exiting the loop cannot be output in synchronization, even if the timing of the output of the final circuit in each pipeline is controlled to begin outputting the test pattern at the same time as described above.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, including a first pipeline that sequentially propagates pieces of pattern data included in a first test pattern, according to a first test period, and outputs the propagated data to the device under test; a second pipeline that sequentially propagates pieces of pattern data included in a second test pattern, according to a second test period that is different from the first test period, and outputs the propagated data to the device under test; a timing control section that controls at least one of a timing at which the first pipeline begins propagating predetermined first pattern data and a timing at which the second pipeline begins propagating predetermined second pattern data, based on the first test period and the second test period; and a judging section that judges pass/fail of the device under test based on a signal output by the device under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows an example of the test sequence performed by each test module 100.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
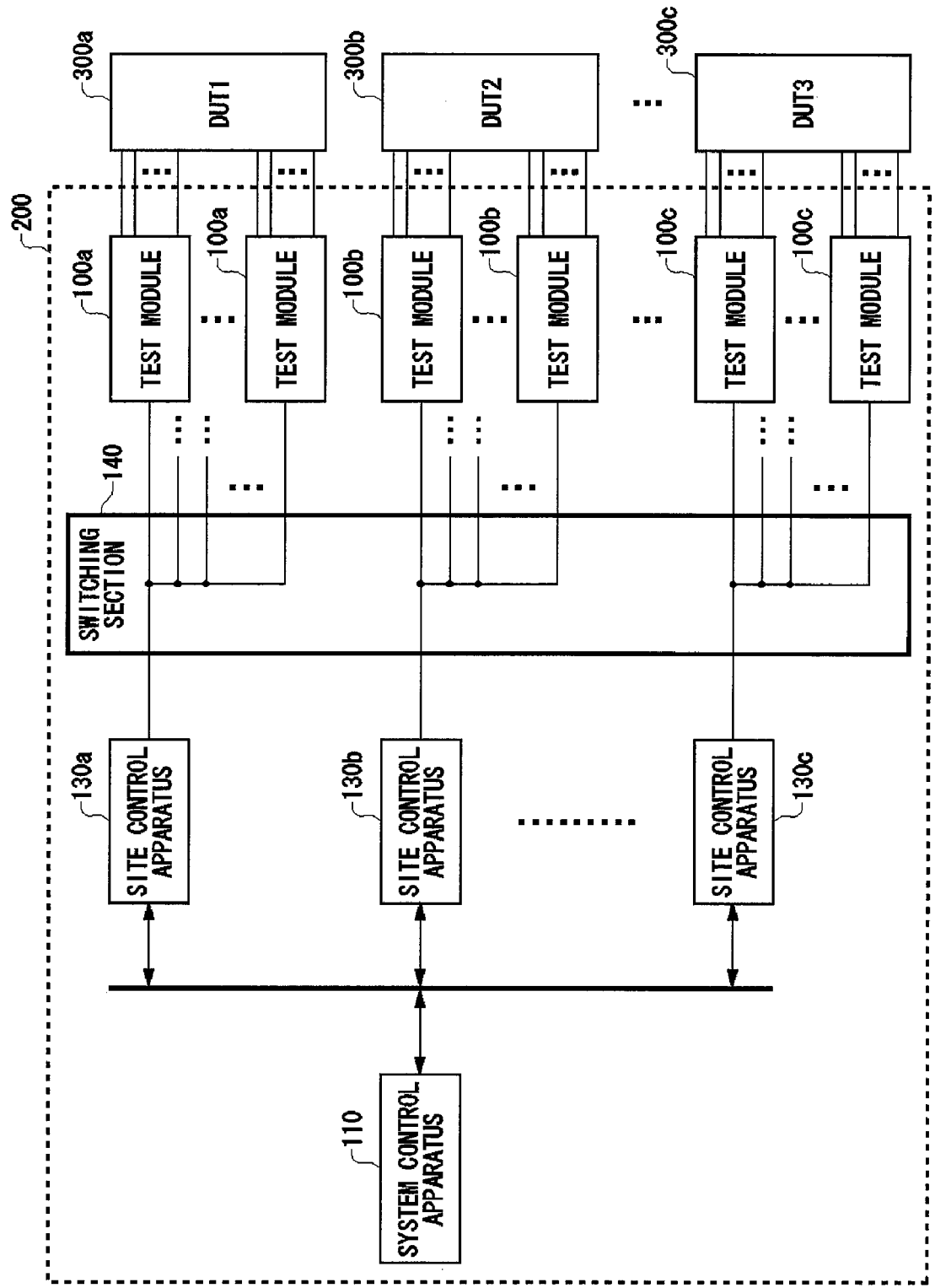
FIG. 1 shows an exemplary configuration of a test apparatus 200 according to an embodiment of the present invention.

FIG. 1 shows an exemplary configuration of a test apparatus 200 according to an embodiment of the present invention. The test apparatus 200 tests devices under test 300, such as semiconductor circuits, and is provided with a system control device 110, a plurality of site control apparatuses 130, a switching section 140, and a plurality of test modules 100.

The system control device 110 receives a test control program, test program data, test pattern data, and the like used by the test apparatus 200 to test the devices under test 300 from the outside via a network, and stores the received program and data. The plurality of site control apparatuses 130 are connected to the system control device 110 via a communication network.

Each of the site control apparatuses 130a~c control testing of one of the devices under test 300. For example, the plurality of site control apparatuses 130 may be disposed to correspond one-to-one with the plurality of devices under test 300, and each site control apparatus 130 may control test modules 100 connected to the corresponding device under test 300. The system control devices 110 and the site control apparatus 130 are one example of an integrated control section.

In FIG. 1, the site control apparatus 130a controls testing of the device under test 300a and the site control apparatus 130b controls testing of the device under test 300b. Furthermore, additional site control apparatuses 130 may control the testing of additional devices under test 300 in the same manner.

More specifically, each site control apparatus 130 acquires a test control program from the system control device 110 and performs the acquired program. Then, based on the test control program, the site control apparatus 130 acquires from the system control device 110 test program data, e.g. a test sequence described hereinafter, and test pattern data, e.g. pattern data described hereinafter, for testing the corresponding device under test 300.

Each site control apparatus 130 stores the test program data and the test pattern data in one or more modules, such as the test modules 100, used to test the corresponding device under test 300, via the switching section 140. Next, the site control apparatus 130 instructs the one or more test modules 100, via the switching section 140, to begin the testing that is based on the test program data and the test pattern data. The site control apparatus 130 receives an interruption or the like indicating that the test is completed from the test module 100, for example, and performs a subsequent test of the test module 100 based on the results of the test.

The switching section 140 connects each of the plurality of site control apparatuses 130 to the one or more test modules 100 controlled thereby, and relays signals therebetween. One predetermined site control apparatus 130 may set the switching section 140 may to connect each site control apparatus 130 to the one or more test modules 100 to be used to test the corresponding device under test 300, based on instruction from a test control program, a user of the test apparatus 200, and the like.

For example, in FIG. 1, the site control apparatus 130a is set to be connected to a plurality of test modules 100a and uses these test modules 100a to test the device under test 300a. Here, the configuration and operation with which other site control apparatuses 130 use the corresponding test modules 100 to test other devices under test 300 is exemplified by the configuration and operation with which the site control apparatus 130a tests the device under test 300a. The following is a description of the configuration and operation with which the site control apparatus 130a tests the device under test 300a.

The test module 100a generates a timing signal that is used to generate the test pattern for testing the device under test 300a, based on instruction from the site control apparatus 130a. A certain test module 100a may receive test results from other test modules 100a and cause the plurality of test modules 100a to perform a sequence according to the pass/fail indicated by the test result. For example, a certain test module 100 may cause one or more of the other test modules 100 to repeat a prescribed operation until the measurement result of the certain test module 100 fulfills a prescribed condition. When the test result fulfills the prescribed condition, the certain test module 100 may perform the next operation.

The plurality of test modules 100a are each connected to one of a plurality of terminals of the device under test 300a, and each test module 100a tests the device under test 300a based on the test sequence and the pattern data stored in the site control apparatus 130a. When testing device under test 300a, each test module 100a generates a test pattern based on the test sequence and the pattern data, and supplies the generated test pattern to the corresponding terminal of the device under test 300a.

Each test module 100a may function as a judging section that acquires an output signal including a result indicating how the device under test 300a operated in response to the test pattern, compares the value of the acquired signal to an expected value, and judges pass/fail of the device under test 300 based on the comparison result.

When processing of the test program data is finished, when an irregularity occurs during processing of the test program data, when a repeat instruction, described hereinafter, is detected, or the like, the test modules 100a may interrupt the corresponding site control apparatus 130a. Notification of this interruption is provided to the site control apparatus 130a via the switching section 140 and an interrupt process is performed by a processor included in the site control apparatus 130a.

The test apparatus 200 described above can be realized through open architecture and can use any type of module that fulfills open architecture specifications. In the test apparatus 200, the modules such as the test modules 100 can be used by being inserted into any connection slot of the switching section 140.

A user of the test apparatus 200 can change the connection state of the switching section 140 via the site control apparatus 130a, for example, so that a plurality of modules used for testing the device under test 300 can be connected to the site control apparatus 130 that controls testing of the device under test 300. By doing this, the user of the test apparatus 200 can select modules suitable for the number of the terminals, the arrangement of the terminals, the type of the terminals, the type of testing, and the like of each of the plurality of devices under test 300. The user can then implement the selected modules on the test apparatus 200.

The test apparatus 200 and the test modules 100 may be a test circuit disposed together with the circuit under test, which is the test target, in the same electronic device. The test circuit may be a BIST circuit of an electronic device, and an examination of the electronic device may be performed by testing the circuit under test. By doing this, the test circuit can check whether the circuit under test can perform the normal operation that is desired of the electronic device.

The test apparatus 200 and the test modules 100 may instead be a test circuit disposed together with the circuit under test, which is the test target, on the same board or in the same apparatus. This test circuit can also check whether the circuit under test can perform the desired normal operation, as described above.

Figure 2:
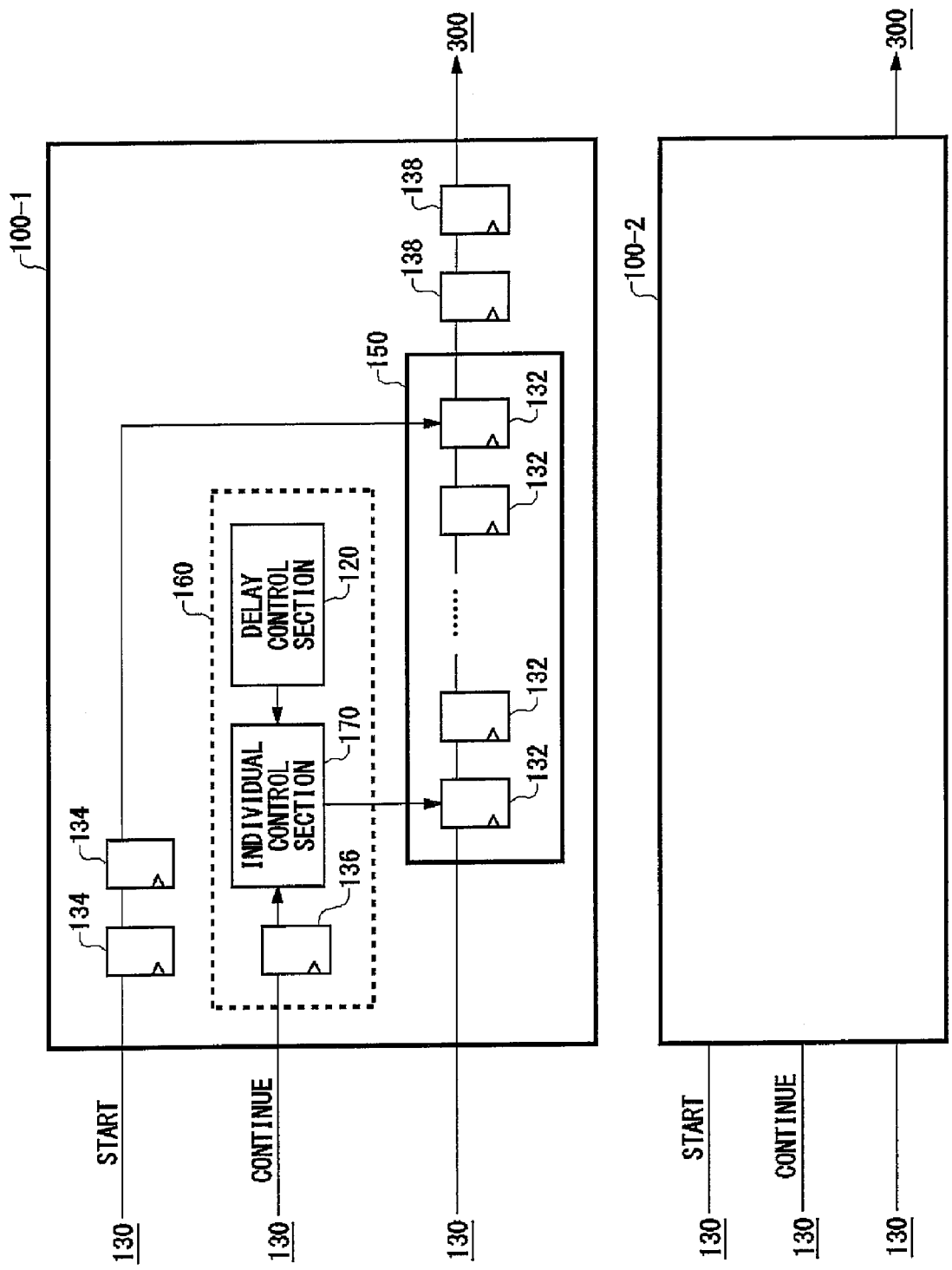
FIG. 2 shows an exemplary configuration of two test modules 100.

FIG. 2 shows an exemplary configuration of two test modules 100. The present embodiment shows a first test module 100-1 and a second test module 100-2. FIG. 2 shows a configuration of the first test module 100-1, and the second test module 100-2 may have an identical configuration.

The first test module 100-1 includes a first pipeline 150, a first timing control section 160, and a plurality of flip-flops 134, 136, 138. The second test module 100-2 may include a second pipeline 150, a second timing control section 160, and the plurality of flip-flops 134, 136, 138, in the same manner.

The first pipeline 150 sequentially propagates each piece of pattern data included in a first test pattern according to a first test period, and supplies the resulting data to the device under test 300. The first pipeline 150 includes a plurality of circuits 132 that are connected in a cascading manner and that operate according to the first test period.

The first pipeline 150 may include circuits 132 that function as flip-flops, for example. In such a case, each circuit 132 acquires a logic pattern, e.g. pattern data, output by the circuit 132 at the previous stage and outputs the acquired logic pattern according to the first test period.

The first pipeline 150 may include a circuit 132 that functions as a first pattern generating section. The first pattern generating section sequentially generates logic patterns with each period of the test pattern by performing a test sequence, which is supplied in advance from the site control apparatus 130, with the first test period, for example. The first pattern generating section outputs the generated logic patterns to the circuit 132 at the subsequent stage. The circuit 132 at the first stage of the first pipeline 150 may function as the first pattern generating section. A plurality of circuits 132 that include the circuit 132 at the first stage may function as the first pattern generating section.

For example, the circuit 132 at the first stage may be a sequencer that sequentially performs the test sequence to sequentially generate a control signal and an address of the circuit 132 at the subsequent stage. The circuit 132 at the aforementioned subsequent stage may be, for example, a pattern memory that stores a logic pattern in each address and sequentially outputs the logic pattern designated by the sequencer to a circuit 132 at a subsequent stage. The sequencer may have a configuration that uses a plurality of stages of circuits 132 to be able to perform complex sequencer controls such as a counter, an adder, a data selector, a shift register, a multiplier, or the like.

FIG. 2 shows the plurality of circuits 132 connected in a cascading manner in a single line, but in other examples the plurality of circuits 132 may be branched. For example, the test module 100 may further include a pipeline that receives a branched output from a prescribed number of circuits 132 from among the circuits 132 shown in FIG. 2. The pipelines at the stages after the branching point may each generate the test pattern having the same first test period. For example, the pipelines at the stages after the branching point may each include a pattern memory and may generate the test pattern corresponding to the addresses sequentially generated by the circuit 132 at the first stage. In this case, it is desirable that the number of stages in each pipeline at a stage after the branching point be the same, so that the first test module 100-1 can output the plurality of test patterns in synchronization.

The second pipeline 150 in the second test module 100-2 sequentially propagates each piece of pattern data included in a second test pattern according to a second test period, which is different than the first test period, and supplies the resulting data to the device under test 300. The second pipeline 150 may have the same configuration as the first pipeline 150 described above. However, it should be noted that the number of stages of circuits 132 functioning as flip-flops may be different between the first pipeline 150 and the second pipeline 150, for example.

When testing of the device under test 300 begins, the first pattern generating section and the second pattern generating section operate in advance, for a time period equal to a number of cycles corresponding to the number of stages of circuits 132 at subsequent stages, to sequentially generate the logic patterns. The first pattern generating section and the second pattern generating section then supply the test patterns to the circuits 132 at subsequent stages. The first pattern generating section and the second pattern generating section may be supplied with signals from the site control apparatus 130 that include instructions to begin testing.

After logic patterns have been generated in each test module 100 for each stage of the pipeline 150, the site control apparatus 130 supplies a start signal START to the circuit 132 at the last stage of each pipeline 150. The circuit 132 at the last stage begins to output the test pattern in response to the start signal. At this time, the first pattern generating section and the second pattern generating section may also be supplied with the start signal. The first pattern generating section and the second pattern generating section may restart generation of the logic patterns in response to the start signal.

The site control apparatus 130 may supply the start signal simultaneously to the flip-flops 134 of each test module 100. The flip-flops 134 in each test module 100 acquire the start signal according to a common reference clock and supply the start signal to the circuit 132 at the final stage in the pipeline 150. The number of stages of the flip-flops 134 in each test module 100 may be the same. By using such a configuration, the start signal can be supplied simultaneously to the circuit 132 at the final stage in each pipeline 150, so that the plurality of test patterns can be output in synchronization.

The test apparatus 200 may generate a test rate clock including test periods obtained by frequency dividing each reference clock obtained by different frequency dividing ratios. For example, the test apparatus 200 may generate a first test rate clock of 100 MHz obtained by frequency dividing a 200 MHz reference clock by two, and a second test rate clock of 66.6 MHz obtained by dividing the 200 MHz reference clock by three.

The flip-flops 138 of each test module 100 acquire the test pattern output by the pipeline 150 according to the common reference clock, and output the acquired test pattern to the device under test 300. The number of stages of the flip-flops 138 in each test module 100 may be the same. Through the operation described above, the output timing of the test pattern when testing of the device under test 300 begins can be synchronized.

Figure 4:
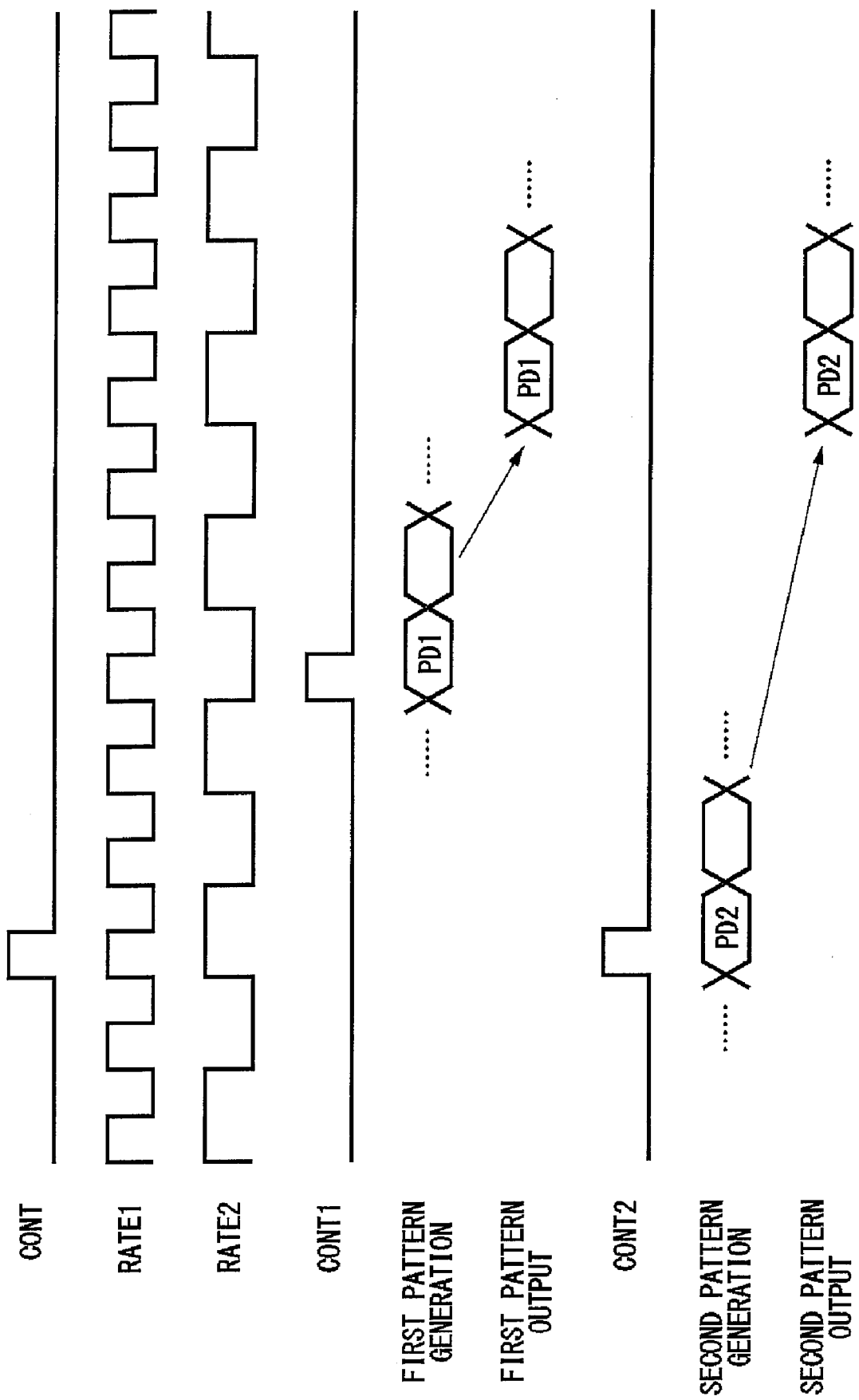
FIG. 4 is a timing chart describing an exemplary operation of the timing control section 160.

The following is a description, using FIGS. 3 and 4, of an operation of the timing control section 160 after the testing begins. The timing control section 160 includes the flip-flop 136, an individual control section 170, and a delay control section 120, as shown in FIG. 2.

FIG. 3 shows an example of the test sequence performed by each test module 100. As described above, the first test module 100-1 performs the first test sequence to generate the test pattern. The second test module 100-2 performs the second test sequence to generate the test pattern. In the present embodiment, the first test period is substantially half of the second test period.

An NOP instruction shown in FIG. 3 is an instruction for outputting the corresponding pattern data and moving on to the next instruction. An SNDC instruction and a JECH instruction are repeat instructions for repeatedly outputting loop-creating pattern data in response to the NOP instruction between the SNDC and the JECH, until a continue signal is received. For example, when the pattern generating section detects the SNDC instruction, the pattern generating section notifies the site control apparatus 130 that the SNDC has been detected. After receiving the notification from the first test module 100-1 or the second test module 100-2, if a prescribed condition is fulfilled, the site control apparatus 130 outputs a continue signal, which instructs the propagation of the first pattern data PD1 and the second pattern data PD2 to begin, to the pattern generating sections of the first test module 100-1 and the second test module 100-2, respectively.

When one of the pattern generating section performs the JECH instruction after receiving the continue signal, the pattern generating section exits from the loop and outputs the next data pattern after the JECH instruction. For example, when the first pipeline 150-1 performs the JECH instruction of line 18 after receiving the continue signal, the first pipeline 150-1 does not return to the SNDC instruction but rather next performs the NOP instruction generating the first pattern data PD1 at line 19, thereby sequentially propagating the first pattern data. When the second pipeline 150-2 performs the JECH instruction of line 9 after receiving the continue signal, the second pipeline 150-2 next performs the NOP instruction generating the second pattern data PD2 at line 10, thereby sequentially propagating the second pattern data.

Since the first test period and the second test period are different, the timing of the output from the first pipeline 150-1 and the output from the second pipeline 150-2 is not synchronized, even when the continue signal is supplied to the first pipeline 150-1 and the second pipeline 150-2 at the same time and the propagation of the first pattern data and the second pattern data begins at the same time. Therefore, the first and second timing control sections 160 control, based on the first test period and the second test period, at least one of a timing at which propagation of the first pattern data begins, in other words a timing at which the continue signal is supplied to the first pipeline 150-1, and a timing at which propagation of the second pattern data begins, in other words a timing at which the continue signal is supplied to the second pipeline 150-2.

Furthermore, since there are cases where the number of stages is different between the first pipeline 150-1 and the second pipeline 150-2, it is desirable that the first and second timing control sections 160 control the timing described above further based on the respective number of stages in the first pipeline 150-1 and the second pipeline 150-2. More specifically, it is desirable that the first and second timing control sections 160 control the timing described above based on a difference RATE1×N1−RATE2×N2 between a product RATE1×N1 of the first test period RATE1 and the number of stages N1 in the first pipeline 150-1 and a product RATE2×N2 of the second test period RATE2 and the number of stages N2 in the second pipeline 150-2. By doing this, the timing at which the first pipeline 150-1 outputs the first pattern data and the timing at which the second pipeline 150-2 outputs the second pattern data can be controlled to be substantially the same.

The individual control section 170 of each timing control section 160 receives the continue signal via the same number of stages of flip-flops 136. The flip-flop 136 of each test module 100 operates according to a common reference clock.

Each individual control section 170 may delay the continue signal by a set delay amount and provide the delayed signal to the corresponding pipeline 150. The delay control section 120 sets the delay amount for at least one of the individual control sections 170 based on the difference between the two products described above, and can thereby adjust the timing at which propagation of the first pattern data begins and the timing at which propagation of the second pattern data begins. A single delay control section 120 may be disposed in common for a plurality of test modules 100.

For example, the delay control section 120 may compare a magnitude relation between the first product RATE1×N1 and the second product RATE2×N2 and then subtract the smaller product from the larger product. The value obtained through this subtraction may be set as the delay amount of the individual control section 170 corresponding to the smaller product. In this case, the delay amount of the individual control section 170 corresponding to the larger product is set to be substantially zero.

In a case where each individual control section 170 can generate a delay amount equal to an integer multiple of the corresponding test period, the delay control section 120 divides the value obtained through the aforementioned subtraction by the test period corresponding to the smaller product. The delay control section 120 may then generate in the corresponding individual control section 170 a delay amount equal to the test period multiplied by an integer corresponding to the quotient obtained from the division described above. In the same manner, in a case where the individual control section 170 can generate a delay amount equal to a multiple of the reference clock, the delay amount may be controlled to correspond to a value obtained by dividing the value obtained from the above subtraction by the period of the reference clock.

The delay control section 120 may be notified in advance of the number of stages in each pipeline 150. The delay control section 120 may also be notified in advance of each test period. Furthermore, the delay control section 120 may store in advance a table in which an ID of each test module 100 is associated with the number of stages in the pipelines of the corresponding test module 100. The delay control section 120 may acquire the ID of each test module 100 and reference the acquired ID with the table to acquire the number of stages in each pipeline 150. The number of stages in each pipeline 150, the IDs, and the table may be stored in the delay control section 120 in advance by a user. The delay control section 120 may be notified of each test period by the site control apparatus 130 or the like.

It is desirable that the time of a single loop from the SNDC instruction to the JECH instruction, in other words a product of the test period and the number of instructions included in one loop, be set to be identical for each test sequence. Since the first test period is substantially half of the second test period in the present embodiment, the number of instructions in one repeat instruction loop of the first test sequence is set to be a multiple of the number of instructions in one loop of the first test sequence.

FIG. 4 is a timing chart describing an exemplary operation of the timing control section 160. The first test period RATE1 of the present embodiment is half of the second test period RATE2=2×RATE1, as described above. For ease of description, the first pipeline 150-1 and the second pipeline 150-2 are both described as having three stages.

Therefore, the first product is RATE1×3 and the second product is RATE1×6. The first individual control section 170 in the first test module 100-1 supplies the first pipeline 150-1 with a continue signal CONT1 that is delayed by three cycles of the first test period RATE1. The second individual control section 170 supplies the second pipeline 150-2 with a continue signal CONT2 that is not delayed.

The second pipeline 150-2 stops generation of the pattern data used to create the loop and begins propagation of the second pattern data PD2, according to the continue signal CONT2. The first pipeline 150-1 stops generation of the pattern data used to create the loop and begins propagation of the first pattern data PD1, according to the delayed continue signal CONT1.

By delaying the continue signal supplied to at least one of the pipelines 150, the first pattern data and the second pattern data can be output simultaneously from the pipelines 150. Therefore, the prescribed pattern data can be supplied in synchronization to the device under test 300, even in a case where the test sequence includes a repeat instruction for repeatedly generating loop-creating pattern data and an instruction for, according to the continue signal, stopping the performance of the repeat instruction and generating the prescribed pattern data.

The site control apparatus 130 outputs the continue signal while the first pattern generating section and the second pattern generating section are both performing the repeat instruction. For example, the site control apparatus 130 may allow a prescribed amount of time to pass according to the interrupt process after receiving notification from the first pattern generating section and the second pattern generating section that the repeat instruction is being performed. After the predetermined amount of time has passed, the site control apparatus 130 may output the continue signal.

The site control apparatus 130 may instead output the continue signal on a condition that the device under test 300 is in a prescribed state while the first pattern generating section and the second pattern generating section are both performing the repeat instruction. For example, the site control apparatus 130 may detect the state of the device under test 300 by using a test module 100, which is different from the test module 100 inputting the test pattern to the device under test 300, to measure the output signal, the power consumption, or the like of the device under test 300. As another example, the site control apparatus 130 may output the continue signal on a condition that a different test module 100 is in a prescribed state while the first pattern generating section and the second pattern generating section are both performing the repeat instructions.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

As made clear from the above, by using the embodiment according to the present invention, a plurality of test modules having differing test periods can be used to supply the device under test with a plurality of test patterns in synchronization. Particularly, while in a stand-by state caused by the performance of the repeat instruction during testing, the test patterns output after the stand-by period ends can be supplied to the device under test in synchronization.

What is claimed is:

1. A test apparatus that tests a device under test, comprising:
a first pipeline that sequentially propagates pieces of pattern data included in a first test pattern, according to a first test period, and outputs the propagated data to the device under test;
a second pipeline that sequentially propagates pieces of pattern data included in a second test pattern, according to a second test period that is different from the first test period, and outputs the propagated data to the device under test;
a timing control section that controls at least one of a timing at which the first pipeline begins propagating predetermined first pattern data and a timing at which the second pipeline begins propagating predetermined second pattern data, based on the first test period and the second test period; and
a judging section that judges pass/fail of the device under test based on a signal output by the device under test,
wherein the timing control section controls at least one of the timing at which the first pipeline begins to propagate the first pattern data and the timing at which the second pipeline begins to propagate the second pattern data, further based on the number of stages of circuits in the first pipeline and the number of stages of circuits in the second pipeline.

2. A test apparatus that tests a device under test, comprising:
a first pipeline that sequentially propagates pieces of pattern data included in a first test pattern, according to a first test period, and outputs the propagated data to the device under test;
a second pipeline that sequentially propagates pieces of pattern data included in a second test pattern, according to a second test period that is different from the first test period, and outputs the propagated data to the device under test;
a timing control section that controls at least one of a timing at which the first pipeline begins propagating predetermined first pattern data and a timing at which the second pipeline begins propagating predetermined second pattern data, based on the first test period and the second test period; and
a judging section that judges pass/fail of the device under test based on a signal output by the device under test,
wherein the timing control section controls at least one of the timing at which the first pipeline begins propagating the first pattern data and the timing at which the second pipeline begins propagating the second pattern data, based on a difference between (i) a product of the first test period and a number of stages of circuits in the first pipeline and (ii) a product of the second test period and a number of stages of circuits in the second pipeline, such that a timing at which the first pipeline outputs the first pattern data is substantially the same as a timing at which the second pipeline outputs the second pattern data.

3. The test apparatus according to claim 2, further comprising an integrated control section that outputs a continue signal instructing initiation of the propagation of the first pattern data and the second pattern data, wherein the timing control section includes:
a first individual control section that delays the continue signal by a determined delay amount and supplies the delayed continue signal to the first pipeline;

a second individual control section that delays the continue signal by a determined delay amount and supplies the delayed continue signal to the second pipeline; and a delay control section that determines at least one of the delay amounts for the first individual control section and the second individual control section based on the difference between (i) the product of the first test period and the number of stages in the first pipeline and (ii) the product of the second test period and the number of stages in the second pipeline.

4. The test apparatus according to claim 3, wherein the first pipeline repeatedly generates one or more pieces of predetermined loop-creating pattern data and sequentially propagates the generated pieces of loop-creating pattern data, and, according to the continue signal, stops generating the loop-creating pattern data and begins propagating the first pattern data, and the second pipeline repeatedly generates one or more pieces of predetermined loop-creating pattern data and sequentially propagates the generated pieces of loop-creating pattern data, and, according to the continue signal, stops generating the loop-creating pattern data and begins propagating the second pattern data.

5. The test apparatus according to claim 4, wherein the first pipeline includes a first pattern generating section that executes a first test sequence including a repeat instruction for repeatedly generating the loop-creating pattern data and an instruction for, according to the continue signal, stopping the execution of the repeat instruction and generating the first pattern data, the second pipeline includes a second pattern generating section that executes a second test sequence including a repeat instruction for repeatedly generating the loop-creating pattern data and an instruction for, according to the continue signal, stopping the performance of the repeat instruction and generating the second pattern data, the integrated control section outputs the continue signal while the first pattern generating section and the second pattern generating section are both performing the repeat instructions, the first individual control section supplies the first pattern generating section with the delayed continue signal, and the second individual control section supplies the second pattern generating section with the delayed continue signal.

6. The test apparatus according to claim 5, wherein the integrated control section outputs the continue signal after a predetermined amount of time has passed since both the first pattern generating section and the second pattern generating section begin to perform the repeat instructions.

7. The test apparatus according to claim 5, wherein the integrated control section outputs the continue signal on a condition that the device under test is in a prescribed state while both the first pattern generating section and the second pattern generating section are performing the repeat instructions.

8. A method of testing a device under test, comprising:
sequentially propagating through a first pipeline pieces of pattern data included in a first test pattern, according to a first test period, and outputting the propagated data to the device under test;

sequentially propagating through a second pipeline pieces of pattern data included in a second test pattern, according to a second test period that is different from the first test period, and outputting the propagated data to the device under test;

controlling at least one of a timing at which the first pipeline begins propagating predetermined first pattern data and a timing at which the second pipeline begins propagating predetermined second pattern data, based on a difference between (i) a product of the first test period and a number of stages of circuits in the first pipeline and (ii) a product of the second test period and a number of stages of circuits in the second pipeline, such that a timing at which the first pipeline outputs the first pattern data is substantially the same as a timing at which the second pipeline outputs the second pattern data; and judging pass/fail of the device under test based on a signal output by the device under test.

9. The method according to claim 8, further comprising:
outputting a continue signal instructing initiation of the propagation of the first pattern data and the second pattern data, wherein the step of controlling includes:
  determining at least one of a first delay amount and a second delay amount based on the difference between (i) the product of the first test period and the number of stages of circuits in the first pipeline and (ii) the product of the second test period and the number of stages of circuits in the second pipeline;
  delaying the continue signal by the first delay amount and supplying the delayed continue signal to the first pipeline; and
  delaying the continue signal by the second delay amount and supplying the delayed continue signal to the second pipeline.

10. The method according to claim 9, wherein
the first pipeline repeatedly generates one or more pieces of predetermined loop-creating pattern data and sequentially propagates the generated pieces of loop-creating pattern data, and, according to the continue signal, stops generating the loop-creating pattern data and begins propagating the first pattern data, and the second pipeline repeatedly generates one or more pieces of predetermined loop-creating pattern data and sequentially propagates the generated pieces of loop-creating pattern data, and, according to the continue signal, stops generating the loop-creating pattern data and begins propagating the second pattern data.

11. The method according to claim 10, wherein
the first pipeline includes a first pattern generating section that executes a first test sequence including a repeat instruction for repeatedly generating the loop-creating pattern data and an instruction for, according to the continue signal, stopping the execution of the repeat instruction and generating the first pattern data, the second pipeline includes a second pattern generating section that executes a second test sequence including a repeat instruction for repeatedly generating the loop-creating pattern data and an instruction for, according to the continue signal, stopping the performance of the repeat instruction and generating the second pattern data, the step of outputting includes outputting the continue signal while the first pattern generating section and the second pattern generating section are both performing the repeat instructions, and the step of controlling includes:
  supplying the first pattern generating section with the continue signal delayed by the first amount; and
  supplying the second pattern generating section with the continue signal delayed by the second amount.

12. The method according to claim 11, wherein the step of outputting includes outputting the continue signal after a predetermined amount of time has passed since both the first pattern generating section and the second pattern generating section begin to perform the repeat instructions.

13. The method according to claim 11, wherein the step of outputting includes outputting the continue signal on a condition that the device under test is in a prescribed state while both the first pattern generating section and the second pattern generating section are performing the repeat instructions.

* * * * *